United States Patent
Wang

(10) Patent No.: US 7,538,020 B2
(45) Date of Patent: May 26, 2009

(54) CHIP PACKAGING PROCESS

(75) Inventor: Jiun-Heng Wang, Tainan County (TW)

(73) Assignees: ChipMOS Technologies Inc., Hsinchu (TW); ChipMOS Technologies (Bermuda) Ltd., Hamilton (BE)

( * ) Notice: Subject to any disclaimer, the term of this patent is extended or adjusted under 35 U.S.C. 154(b) by 50 days.

(21) Appl. No.: 11/454,558

(22) Filed: Jun. 16, 2006

(65) Prior Publication Data

US 2007/0202681 A1    Aug. 30, 2007

(30) Foreign Application Priority Data

Feb. 27, 2006    (TW) .............................. 95106519 A

(51) Int. Cl.
*H01L 21/44* (2006.01)

(52) U.S. Cl. .............................. 438/613; 257/E21.508; 438/612

(58) Field of Classification Search ................. 438/906, 438/612, 613; 257/E21.508
See application file for complete search history.

(56) References Cited

U.S. PATENT DOCUMENTS 6,416,395 B1 *    7/2002   Hembree ..................... 451/49
6,589,870 B1 *    7/2003   Katoh ........................ 438/690
2005/0161814 A1 * 7/2005   Mizukoshi et al. .......... 257/737

FOREIGN PATENT DOCUMENTS

TW           517367        1/2003
TW          092133255     11/2003

* cited by examiner

*Primary Examiner*—Asok K Sarkar
(74) *Attorney, Agent, or Firm*—J.C. Patents

(57) ABSTRACT

A bumping process including the following steps is provided. A main body with a plurality of contacts thereon is provided. A protective layer with a plurality of first openings is formed on the main body. The first openings in the protective layer expose the respective contacts. An under-bump-metallurgy layer is formed on the protective layer and the contacts. A patterned photoresist layer having a plurality of second openings located above their corresponding first openings is formed over the under-bump-metallurgy layer. A plurality of bumps is formed inside the second openings above their corresponding contacts such that the level of the surface of the bumps away from the protective layer is lower than that of the photoresist layer. The bumps are etched to planarize the surfaces of the bumps. The patterned photoresist layer and part of the under-bump-metallurgy layer not covered by the bumps are removed.

5 Claims, 4 Drawing Sheets

CHIP PACKAGING PROCESS

CROSS-REFERENCE TO RELATED APPLICATION

This application claims the priority benefit of Taiwan application serial no. 95106519, filed on Feb. 27, 2006. All disclosure of the Taiwan application is incorporated herein by reference.

BACKGROUND OF THE INVENTION

1. Field of the Invention

The present invention relates to a bumping process, more particularly to a bumping process capable of producing a bump having a planar surface.

2. Description of Related Art

Flip chip interconnect technology is a packaging technique for connecting a die to a circuit board. The process mainly includes forming a plurality of bumps on the respective contacts of the die and flipping the die over so that the bumps can connect with the respective bonding pads on the circuit board. In other words, the die is electrically connected to the circuit board via the bumps.

FIGS. 1A through 1C are schematic cross-sectional views showing the steps in a conventional method of forming bumps on the contacts of a die. First; as shown in FIG. 1A, a die 110 that has an active surface 112 and a plurality of contacts 114 disposed thereon is provided. Then, a protective layer 120 is formed on the active surface 112.

Next, as shown in FIG. 1B, a photolithographic/etching process is performed to form a plurality of openings 122 for exposing the respective contacts 114, located on protective layer 120. It should be noted that the protective layer 120 has a bulging portion P close to each opening 122 resulting from the opening 122 being slightly smaller than the contact 114. Then, an under-bump-metallurgy layer 150 is formed on the protective layer 120 and the contacts 114. After that, a photoresist layer 130 is formed on the under-bump-metallurgy layer 150. Next, a photolithographic/etching process is performed to form a plurality of openings 132 in the photoresist layer 130. The openings 132 expose the areas in the under-bump-metallurgy layer 150 that correspond to the contacts 114. Then, an electroplating process is performed to deposit gold inside the openings 132 so that a plurality of gold bumps is formed on the die 110. The gold bumps 140 are mechanically and electrically connected to their respective contacts through the under-bump-metallurgy layer 150.

As shown in FIG. 1C, the photoresist layer 130 is removed. Then, using the gold bumps 140 as a mask, the under-bump-metallurgy layer 150 not covered by the gold bumps 140 is removed to form a die structure 100 having a plurality of gold bumps 140 thereon. Because the area covered by the gold bump 140 includes a circular bulging portion P of the protective layer 120, the gold bump 140 also has a circular bulging portion Q corresponding to the circular bulging portion P of the protective layer 120.

FIG. 2 is a schematic cross-sectional view of a circuit board connected to a die through a bump fabricated using the conventional technique. In the conventional technique, the circuit board 200 is electrically connected to the die 110 through a single conductive direction bonding film 250 and prefabricated gold bumps 140. The single conductive direction bonding film 250 has a plurality of particles 252, each having a conductive inner core and an insulating outer layer, and the circuit board 200 has a plurality of bonding pads 210 thereon.

More specifically, when the circuit board 200 is electrically connected to the die 110 through the single conductive direction bonding film 250 and the gold bumps 140, some of the particles 252 will be compressed by the bulging portion Q of the gold bumps 140 and the bonding pads 210. Hence, the insulating outer layer of the particles 252 may break when the particles are subjected to compression between the bulging portion Q and the bonding pad 210 so that the inner conductive core of the particles are exposed. As a result, the conductive core of the particle 252 is electrically connected to the bulging portion Q and the bonding pad 210 through the broken outer insulating layer. Thus, an electrical connection between the die 110 and the circuit board 200 is formed.

It should be noted that the bulging portion Q of the gold bump 140 has a very small surface area. Therefore, when the gold bump 140 is electrically connected to the bonding pad 210 through the single conductive direction bonding film 250, the electrical connection has a lower reliability.

SUMMARY OF THE INVENTION

Accordingly, at least one objective of the present invention is to provide a bumping process for forming a bump having a plane surface.

To achieve this and other advantages and in accordance with the purpose of the invention, as embodied and broadly described herein, the invention provides a bumping process. First, a main body is provided. Then, a plurality of contacts is formed on the main body. Next, a protective layer with a plurality of first openings is formed on the main body. The first openings expose the respective contacts on the main body. Then, an under-bump-metallurgy layer is formed on the protective layer and the contacts. Afterwards, a patterned photoresist layer having a plurality of second openings located on their respective first openings is formed on the under-bump-metallurgy layer. Thereafter, a plurality of bumps is formed inside the second openings corresponding to their respective contacts. The bumps and the contacts are electrically connected. Furthermore, the level of the surfaces of the bumps away from the protective layer is lower than that of the photoresist layer. Then, the bumps are etched to planarize the surfaces of the bumps. After that, the patterned photoresist layer is removed. Thereafter, part of the under-bump-metallurgy layer not covered by the bumps is removed to form a plurality of under-bump-metallurgy pads for connecting the bumps to the respective contacts.

According to one preferred embodiment of the present invention, the foregoing bump process further includes cleaning the surface of the bumps with plasma before etching the bumps.

According to one preferred embodiment of the present invention, the method of forming the bumps inside the respective second openings in the foregoing bumping process includes performing an electroplating process.

According to one preferred embodiment of the present invention, the bumps inside the second openings in the foregoing bumping process are made of gold.

In the present invention, the bumps are etched after forming the bumps but before removing the patterned photoresist layer to planarize the surface of the bumps. Therefore, comparing with the conventional technique, the present invention is able to produce an electrical connection between the bumps and the bonding pads with a higher reliability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
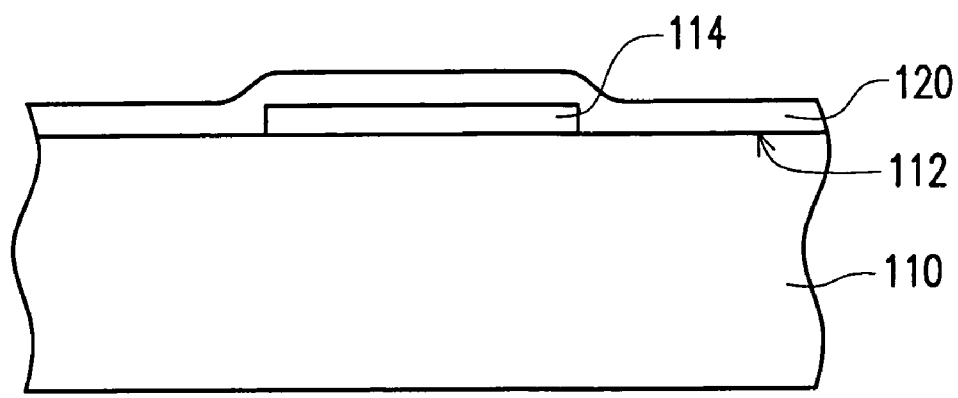
FIGS. 1A through 1C are schematic cross-sectional views showing the steps in a conventional method of forming bumps on the contacts of a die.
Figure 1B:
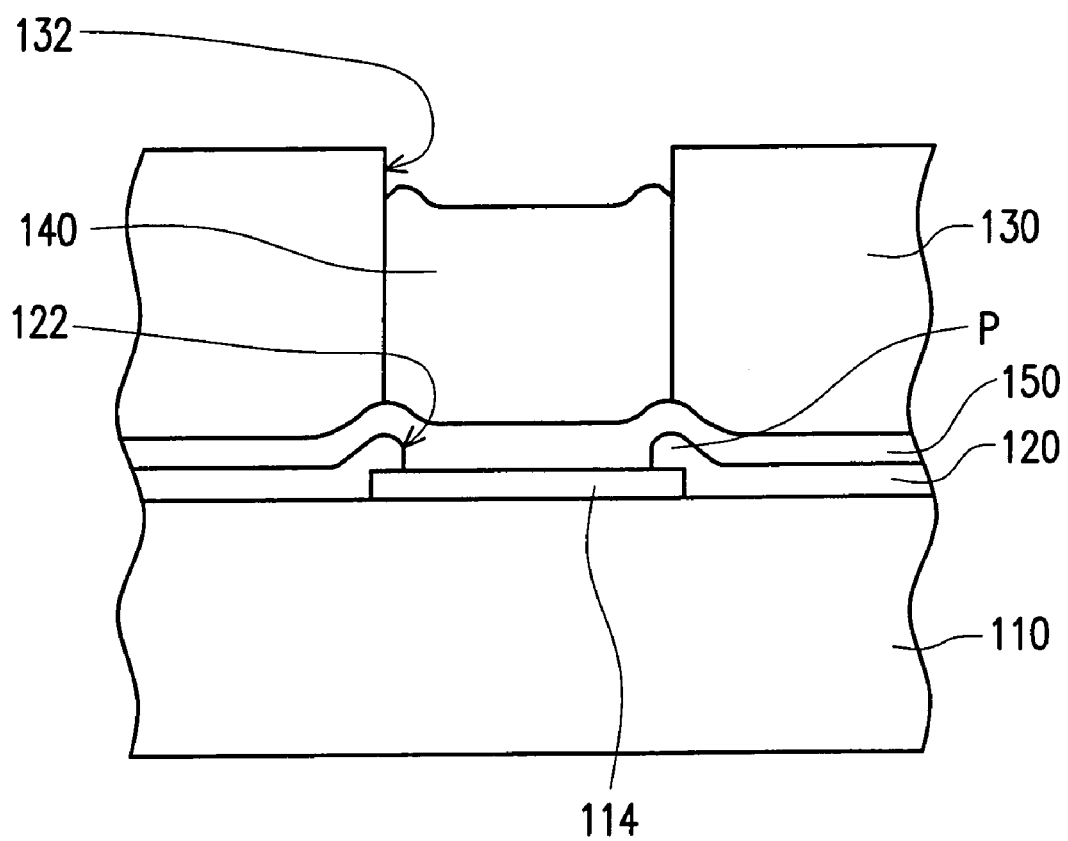
Figure 1C:
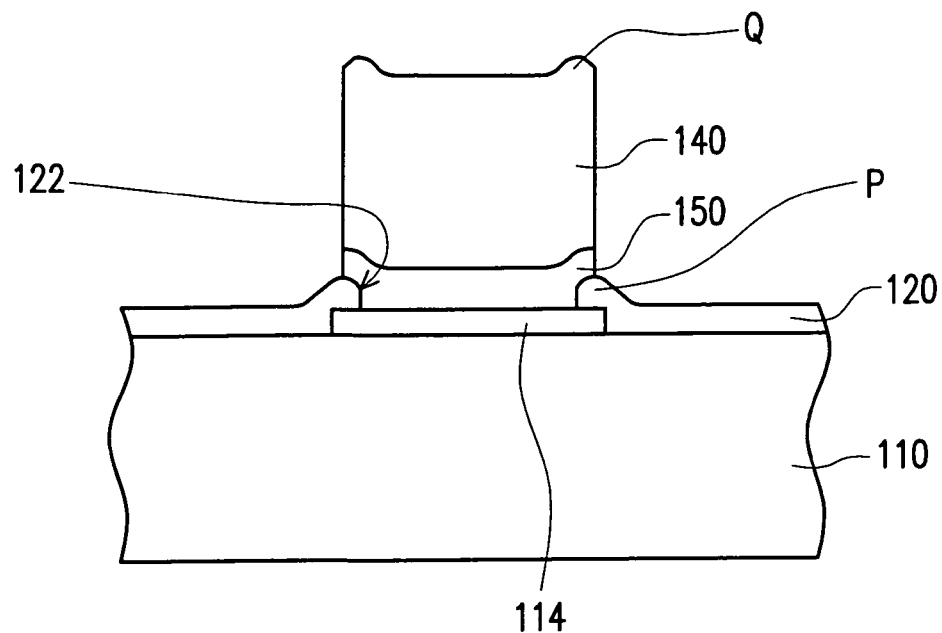
Figure 2:
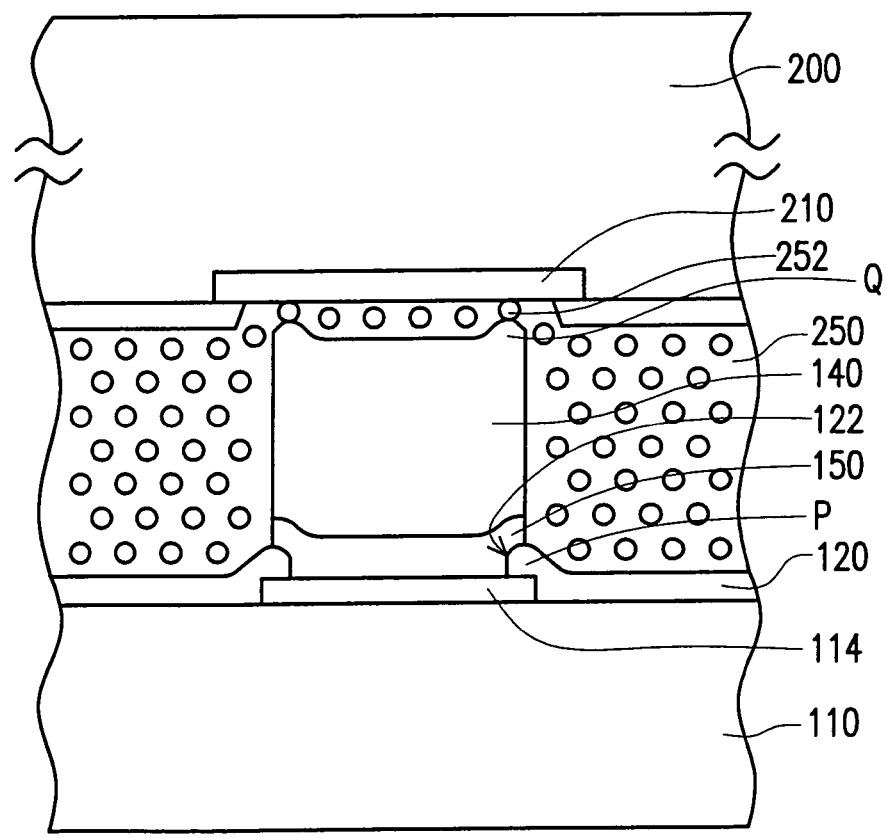
FIG. 2 is a schematic cross-sectional view of a circuit board connected to a die through a bump fabricated using the conventional technique.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
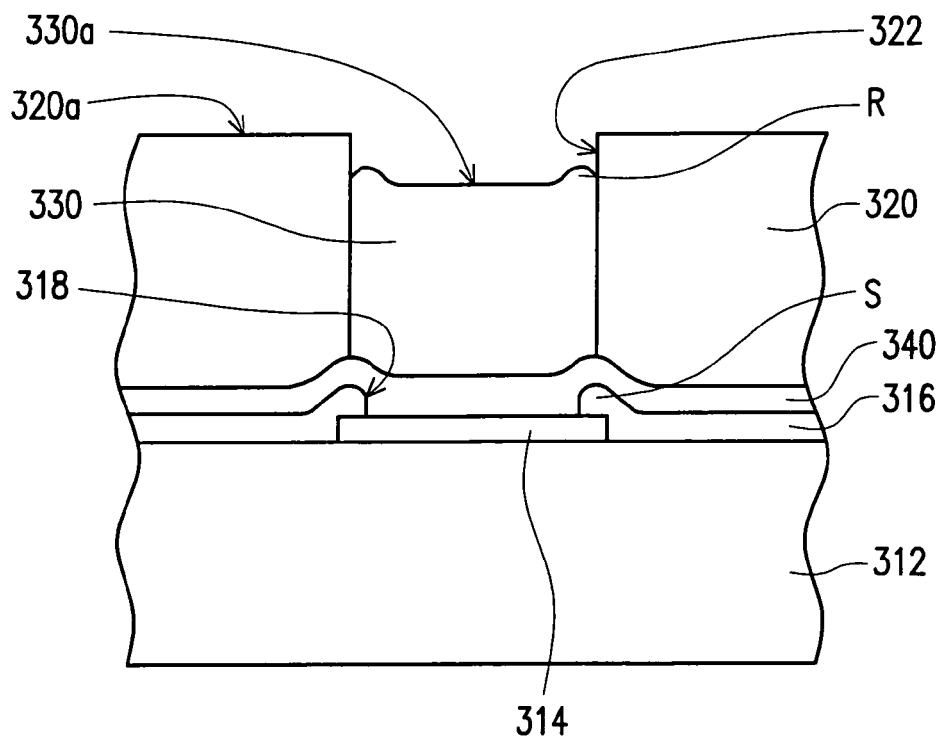
FIGS. 3A through 3C are schematic cross-sectional views showing the steps in a bumping process for producing bumps.
Figure 3B:
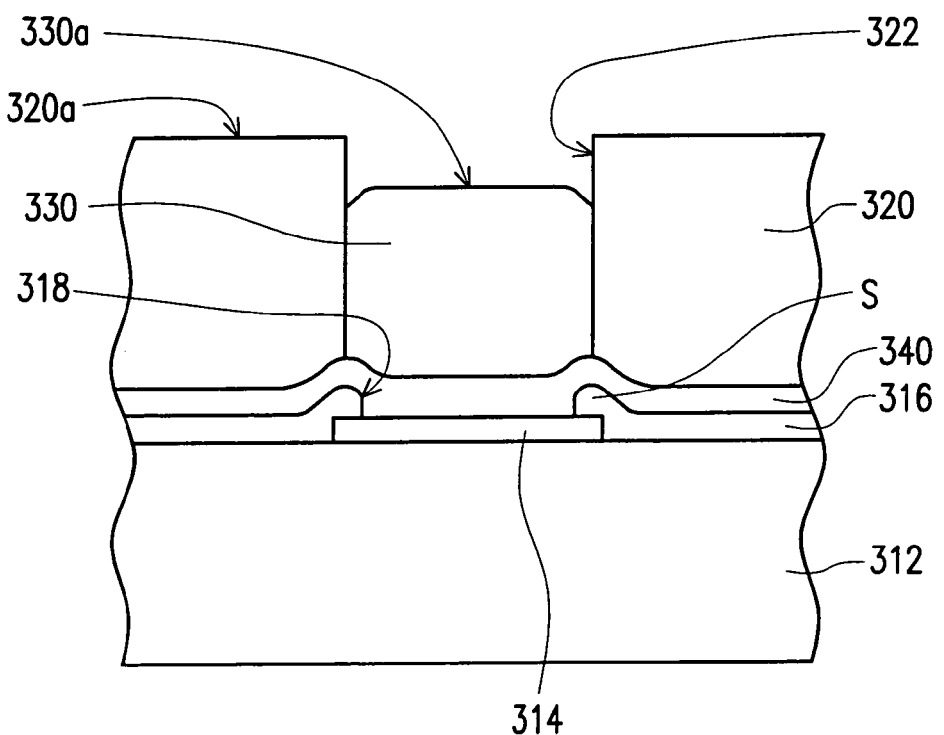
Figure 3C:
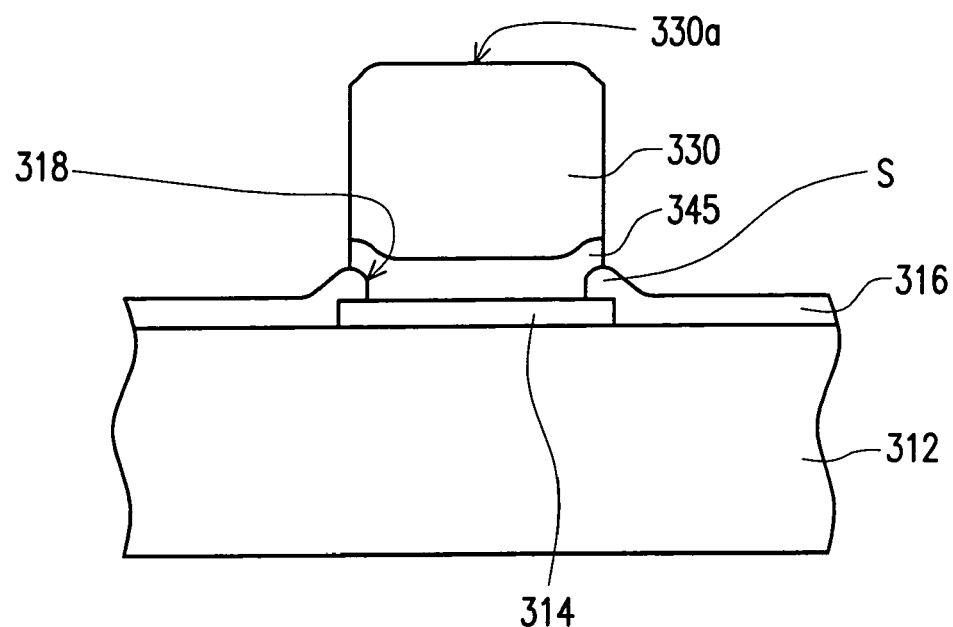

FIGS. 3A through 3C are schematic cross-sectional views showing the steps in a bumping process for producing bumps. First, as shown in FIG. 3A, a main body 312 with a plurality of contacts 314 thereon is provided. The main body is a die, a circuit board or other similar circuit element, for example. Then, a protective layer 316 is formed on the main body 312. The method of forming the protective layer 316 includes performing a screen-printing process or coating, or directly attaching a dry film of protective material on the main body 312, for example.

Next, a plurality of first opening 318 is formed over the protective layer 316 to expose the respective contacts 314, for example, by performing a photolithographic/etching process. Then, an under-bump-metallurgy layer 340 is formed over the protective layer 316 and the contacts 314. After that, a photoresist material layer (not shown) is formed on the under-bump-metallurgy layer 340 by coating, electro-depositing or direct attaching a dry photoresist film, for example. Then, the photoresist material layer is patterned to form a patterned photoresist layer 320, for example, by performing a photolithographic/etching process. The patterned photoresist layer 320 has a plurality of second openings 322 located above their corresponding first openings 318.

Next, a plurality of bumps 330 is formed inside the respective second openings 322, for example, by electroplating or other method. The bumps 330 are made of gold, for example. Furthermore, the bumps 330 are electrically connected to their corresponding contacts 314. Moreover, the level of the surface 330a of the bumps 330 away from the protective layer 316 is lower than that of the surface 320a of the patterned photoresist layer 320 away from the protective layer 316. It should be noted that the protective layer 316 close to the first opening 318 has a bulging portion S due to the protective layer 316 having a constant thickness. Consequently, the bump 330 also has a bulging portion R in an area corresponding to the bulging portion S of the protective layer 316.

As shown in FIG. 3B, the bumps 330 are etched. Because the etching solution has a higher etching rate near the bulging portion R of the bumps 330, the etching process can remove the bulging portion R and planarize the surface 330a of the bumps 330. Preferably, to enhance the planarizing effect of the etching process, the present embodiment may include cleaning the surface 330a of the bumps 330 using plasma before etching the bumps 330.

Figure 4:
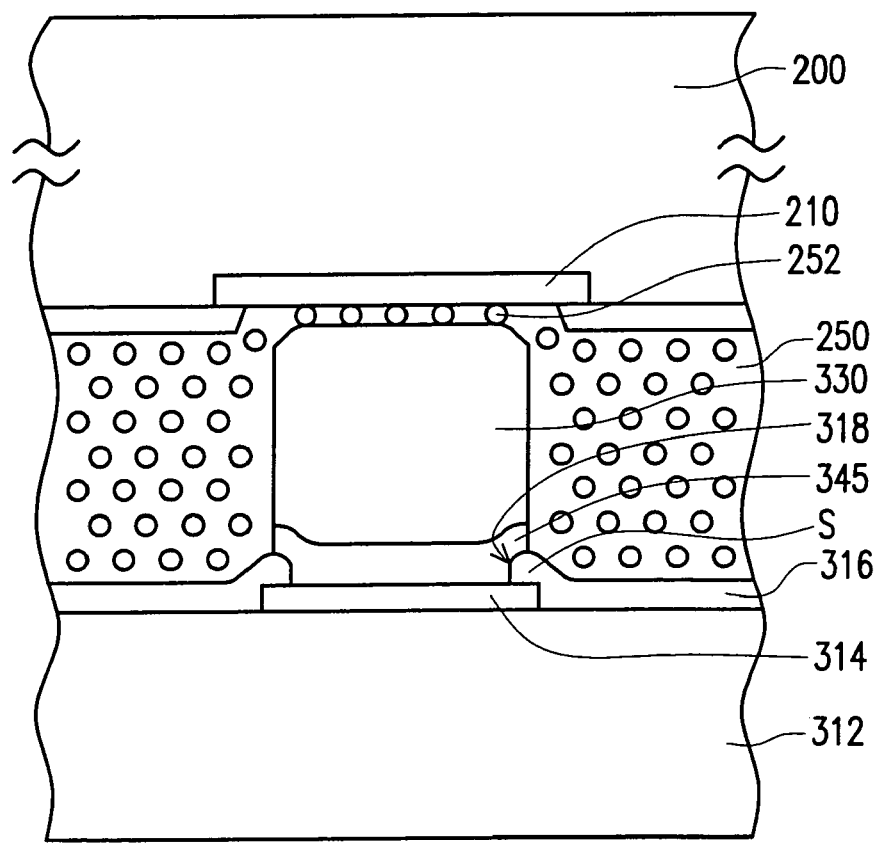
FIG. 4 is a schematic cross-sectional view showing the electrical connection between a main body with bumps fabricated according to the present embodiment and a circuit board.

As shown in FIG. 3C, the patterned photoresist layer 320 is removed. Then, using the bumps 330 as a mask, the under-bump-metallurgy layer 340 not covered by the bumps 330 is removed to form a plurality of under-bump-metallurgy pads 345. The bumps 330 are electrically connected to the bonding pads 314 through their respective under-bump-metallurgy pads 345. FIG. 4 is a schematic cross-sectional view showing the electrical connection between a main body with bumps fabricated according to the present embodiment and a circuit board. In the present embodiment, a circuit board 200 is electrically connected to the main body 312 through a single conductive direction bonding film 250 and pre-fabricated bumps 330. The single conductive direction bonding film 250 has a plurality of embedded particles, each having an inner conductive core and an insulating outer layer, and the circuit board 200 has a plurality of bonding pads 210 thereon.

More specifically, when the circuit board 200 is electrically connected to the main body 312 through the single conductive direction bonding film 250 and the bumps 330, some of the particles 252 are compressed by the surface 330a of the bumps 330 and the bonding pads 210. The outer insulating layer of these particles, due to the compression exerted by the surfaces 330a and the bonding pads 210, may break up and expose the conductive core. Therefore, the bumps 330 and the bonding pads 210 are electrically connected via the conductive core of the particles 252 exposed by the breaks in the outer insulating layer. In other words, an electrical connection between the main body 312 and the circuit board 200 is established.

In summary, the bumps are etched after forming the bumps but before removing the patterned photoresist layer in the present invention so that the surface of the bumps are planarized. Hence, when the gold bumps are electrically connected to the bonding pads through the single conductive direction bonding film, the entire surface of the bumps is utilized to compress the particles embedded within the single conductive direction bonding film. Therefore, comparing with the conventional technique that only uses the bulging portion of the gold bumps to compress the particles within the single conductive direction bonding film, the present invention is able to produce an electrical connection with a higher reliability between the bumps and the bonding pads.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip packaging process, comprising the steps of:
    providing a chip having a plurality of contacts thereon;
    forming a protective layer on the chip, wherein the protective layer has a plurality of first openings exposing the respective contacts on the chip;
    forming an under-bump-metallurgy layer over the protective layer and the contacts;
    forming a patterned photoresist layer over the under-bump-metallurgy layer, wherein the patterned photoresist layer has a plurality of second openings located above the respective first openings;

forming a plurality of bumps inside the second openings above their corresponding contacts, wherein the level of the surface of the bumps away from the protective layer is lower than the surface of the patterned photoresist layer away from the protective layer;

etching the bumps to planarize the top surface of the bumps, wherein the bumps are encapsulated by the patterned photoresist layer except the top surface of the bumps;

removing the patterned photoresist layer after the top surface of the bumps are planarized;

removing the under-bump-metallurgy layer not covered by the bumps to form a plurality of under-bump-metallurgy pads, wherein the bumps are electrically connected to the contacts through their corresponding under-bump-metallurgy pads;

providing a circuit board having a plurality of bonding pads thereon; and bonding the chip and the circuit board by providing a single conductive direction bonding film therebetween, wherein the planarized surfaces of the bumps are electrically connected to the bonding pads through the single conductive direction bonding film.

2. The chip packaging process of claim 1 further comprises a step of cleaning the surface of the bumps with plasma before etching the bumps.

3. The chip packaging process of claim 1, wherein the step for forming the bumps inside the respective second openings includes electroplating.

4. The chip packaging process of claim 1, wherein the material constituting the bumps inside the respective second openings comprises gold.

5. The chip packaging process of claim 1, wherein the single conductive direction bonding film has a plurality of embedded particles, each embedded particle has an inner conductive core and an outer insulating layer, some of the embedded particles are compressed by the planarized surfaces of the bumps and the bonding pads, and the outer insulating layers of the embedded particles are break up and expose the inner conductive cores, so that the bumps and the bonding pads are electrically connected via the exposed inner conductive cores.

* * * * *